United States Patent
Misaki

(10) Patent No.: US 9,035,302 B2
(45) Date of Patent: May 19, 2015

(54) ACTIVE MATRIX INCLUDING STRESSED CAPACITOR INSULATION

(71) Applicant: Sharp Kabushiki Kaisha, Osaka-shi, Osaka (JP)

(72) Inventor: Katsunori Misaki, Yonago (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/368,557

(22) PCT Filed: Dec. 18, 2012

(86) PCT No.: PCT/JP2012/082784
§ 371 (c)(1),
(2) Date: Jun. 25, 2014

(87) PCT Pub. No.: WO2013/099697
PCT Pub. Date: Jul. 4, 2013

(65) Prior Publication Data
US 2014/0346504 A1    Nov. 27, 2014

(30) Foreign Application Priority Data
Dec. 28, 2011   (JP) ................................ 2011-289552

(51) Int. Cl.
*H01L 27/06*  (2006.01)
*H01L 27/12*  (2006.01)
(Continued)

(52) U.S. Cl.
CPC .......... *H01L 27/124* (2013.01); *H01L 21/0217* (2013.01); *H01L 21/02274* (2013.01); *G02F 1/13439* (2013.01); *H01L 23/53295* (2013.01); *H01L 29/45* (2013.01);
(Continued)

(58) Field of Classification Search
CPC ...................... H01L 27/1248; G02F 1/136213
See application file for complete search history.

(56) References Cited

U.S. PATENT DOCUMENTS 6,646,707 B2   11/2003   Noh et al.
2008/0283841 A1*  11/2008   Yamayoshi ..................... 257/71
(Continued)

FOREIGN PATENT DOCUMENTS

JP   2002-182230 A   6/2002
JP   2011-053443 A   3/2011
JP   2012-134475 A   7/2012

OTHER PUBLICATIONS

Written Opinion of the International Search Authority, published Jun. 28, 2014 in PCT/JP2012/082784.*
(Continued)

*Primary Examiner* — Thomas L Dickey
(74) *Attorney, Agent, or Firm* — Keating & Bennett, LLP

(57) ABSTRACT

This active-matrix substrate (100A) includes: a substrate (11); a TFT (10A) which is supported on the substrate and which includes a semiconductor layer (14), a gate electrode (12g), a source electrode (16S) and a drain electrode (16D); first and second transparent conductive layers (22, 24), at least one of which is electrically connected to the drain electrode of the TFT and has tensile stress; and a stack of inorganic insulating layers (23S1) which has been formed between the first and second transparent conductive layers. The stack includes a first inorganic insulating layer (23a1) with tensile stress and second and third inorganic insulating layers (23b1, 23c1) which have been formed so as to sandwich the first inorganic insulating layer between them and which have compressive stress. The stack as a whole has tensile stress.

13 Claims, 8 Drawing Sheets

(51) Int. Cl.
*H01L 21/02* (2006.01)
*H01L 29/45* (2006.01)
*H01L 29/786* (2006.01)
*H01L 29/41* (2006.01)
*G02F 1/1343* (2006.01)
*H01L 23/532* (2006.01)

(52) U.S. Cl.
CPC ....... *H01L 29/7869* (2013.01); *H01L 27/1248* (2013.01); *H01L 2924/0002* (2013.01); *H01L 27/1225* (2013.01); *H01L 29/41* (2013.01)

(56) References Cited

U.S. PATENT DOCUMENTS

2011/0050551 A1 3/2011 Ota et al.
2012/0138922 A1 6/2012 Yamazaki et al.

OTHER PUBLICATIONS

Official Communication issued in International Patent Application No. PCT/JP2012/082784, mailed on Feb. 5, 2013.

* cited by examiner (a)

(b)

ACTIVE MATRIX INCLUDING STRESSED CAPACITOR INSULATION

TECHNICAL FIELD

The present invention relates to an active-matrix substrate and more particularly relates to an active-matrix substrate which can be used effectively in a liquid crystal display device.

BACKGROUND ART

An active-matrix-addressed liquid crystal display device generally includes an active-matrix substrate on which thin-film transistors (TFTs) are provided as switching elements for respective pixels (and which is sometimes called a "TFT substrate"), a counter substrate on which color filters and other members are arranged (and which is sometimes called a "color filter substrate"), and a liquid crystal layer which is interposed between the active-matrix substrate and the counter substrate. An electric field, of which the intensity is represented by the potential difference between pixel electrodes that are electrically connected to the thin-film transistors and a common electrode, is applied to the liquid crystal layer to change the orientation states of liquid crystal molecules in the liquid crystal layer. In this manner, a display operation can be conducted with the optical transmittance of each pixel controlled.

Various display modes have been proposed and adopted for active-matrix-addressed liquid crystal display devices according to their intended application. Examples of those display modes include a TN (Twisted Nematic) mode, a VA (Vertical Alignment) mode, an IPS (In-Plane-Switching) mode and an FFS (Fringe Field Switching) mode.

Among those liquid crystal display devices, there are ones of which the active-matrix substrate includes two transparent conductive layers that have been formed so as to interpose an inorganic insulating layer between them. The structure of an electrode which is formed by such a pair of transparent conductive layers that interpose an inorganic insulating layer between them will be referred to herein as a "double-layer electrode structure" for the sake of simplicity.

For example, in a general FFS mode, the lower one of the two transparent conductive layers is provided as a common electrode and the upper transparent conductive layer is provided as pixel electrodes with slits as disclosed in Patent Document No. 1. Meanwhile, a configuration in which pixel electrodes are arranged as the lower electrodes and a common electrode with slits is arranged as the upper electrode is also known as disclosed in Patent Document No. 2.

CITATION LIST

Patent Literature

Patent Document No. 1: Japanese Laid-Open Patent Publication No. 2002-182230
Patent Document No. 2: Japanese Laid-Open Patent Publication No. 2011-53443

SUMMARY OF INVENTION

Technical Problem

Also, as will be described later, the applicant of the present application researched and developed a liquid crystal display device including a storage capacitor with the double-layer electrode structure. Specifically, we proposed a configuration in which the lower transparent conductive layer is used as a storage capacitor counter electrode (to which either a common voltage or a storage capacitor counter voltage is applied) and the upper transparent conductive layer is used as pixel electrodes. This liquid crystal display device operates in the VA mode but is applicable to any other display mode, too.

As will be described in detail later with reference to a comparative example, the present inventor discovered that an active-matrix substrate with such a double-layer electrode structure has the following drawbacks.

Firstly, in the double-layer electrode structure, the interlevel insulating film arranged between the two transparent conductive layers (e.g., the third interlevel insulating layer 23P of the active-matrix substrate 200A of the comparative example shown in FIG. 8) cannot make close contact with the transparent conductive layers, and would peel off easily from them, which is a problem.

Secondly, the present inventor tentatively used various inorganic insulating layers to increase the degree of close contact between the transparent conductive layers and the interlevel insulating film in the double-layer electrode structure. As a result, if an inorganic insulating layer that would increase the degree of close contact (such as a silicon nitride ($SiN_x$) layer with tensile stress) was used, oxides in the vicinity of the interface between those transparent conductive layers (which are generally made of a transparent inorganic oxide such as ITO (indium tin oxide) or IZO (indium zinc oxide)) and the silicon nitride layer were reduced and metalized by the silicon nitride layer, thus causing a decrease in the optical transmittance of the transparent conductive layers, which is also a problem.

An object of the present invention is to provide an active-matrix substrate that would contribute to overcoming at least one of these problems.

Solution to Problem

An active-matrix substrate according to an embodiment of the present invention includes: a substrate; a thin-film transistor which is supported on the substrate and which includes a semiconductor layer, a gate electrode, a source electrode and a drain electrode; first and second transparent conductive layers, at least one of which is electrically connected to the drain electrode of the thin-film transistor; and a stack of inorganic insulating layers which has been formed between the first and second transparent conductive layers. The stack includes a first inorganic insulating layer with tensile stress and second and third inorganic insulating layers which have been formed so as to sandwich the first inorganic insulating layer between them and which have compressive stress. The stack as a whole has tensile stress. In the active-matrix substrate according to this embodiment of the present invention, the first inorganic insulating layer with tensile stress contacts directly with neither the first transparent conductive layer nor the second transparent conductive layer.

In one embodiment, the first inorganic insulating layer is a silicon nitride layer with a refractive index of 1.804 or less.

In one embodiment, the second and third inorganic insulating layers are silicon nitride layers with a refractive index of 1.805 or more.

In one embodiment, the first transparent conductive layer is arranged closer to the substrate than the second transparent conductive layer is, and the second inorganic insulating layer is arranged closer to the substrate than the third inorganic insulating layer is. And the stack further includes a fourth inorganic insulating layer between the first transparent conductive layer and the second inorganic insulating layer.

In one embodiment, the fourth inorganic insulating layer is a silicon oxide layer with a refractive index of 1.4 to 1.6.

In one embodiment, the stack further includes a fifth inorganic insulating layer between the second transparent conductive layer and the third inorganic insulating layer.

In one embodiment, the fifth inorganic insulating layer is a silicon oxide layer with a refractive index of 1.4 to 1.6.

In one embodiment, the first and second transparent conductive layers are either ITO layers or IZO layers.

In one embodiment, the semiconductor layer is an oxide semiconductor layer, which may include an In—Ga—Zn—O based semiconductor (IGZO based semiconductor), for example.

In one embodiment, the first transparent conductive layer is electrically floating and the second transparent conductive layer is a pixel electrode.

In one embodiment, the first transparent conductive layer is a storage capacitor counter electrode and the second transparent conductive layer is a pixel electrode. An active-matrix substrate according to this embodiment may be used in a vertical alignment (VA) mode liquid crystal display device, for example.

In one embodiment, the first transparent conductive layer is a common electrode and the second transparent conductive layer is a pixel electrode with a plurality of slits. An active-matrix substrate according to this embodiment may be used in an FFS mode liquid crystal display device, for example.

In one embodiment, the active-matrix substrate further includes an organic insulating layer which covers the thin-film transistor and a portion of which contacts directly with a portion of the stack.

Advantageous Effects of Invention

According to an embodiment of the present invention, a stack of inorganic insulating layers which is arranged between two transparent conductive layers with tensile stress can minimize peeling. In addition, according to an embodiment of the present invention, a first inorganic insulating layer which is included in the stack and which has tensile stress contacts directly with neither the first transparent conductive layer nor the second transparent conductive layer. That is why even if the first inorganic insulating layer is formed out of a silicon nitride layer, for example, the transparent oxide (such as ITO or IZO) that makes the first and second transparent conductive layers is not reduced and a decrease in optical transmittance can be avoided.

DESCRIPTION OF EMBODIMENTS

Hereinafter, the structure and manufacturing process of an active-matrix substrate according to an embodiment of the present invention will be described with reference to the accompanying drawings. In the following description, an active-matrix substrate for use in a VA mode liquid crystal display device with a double layer electrode structure will be described as an example. However, this is just an example of the present invention. Rather, an embodiment of the present invention is also applicable to an active-matrix substrate for use in the FFS mode liquid crystal display device described above and various other types of display devices.

Figure 1:
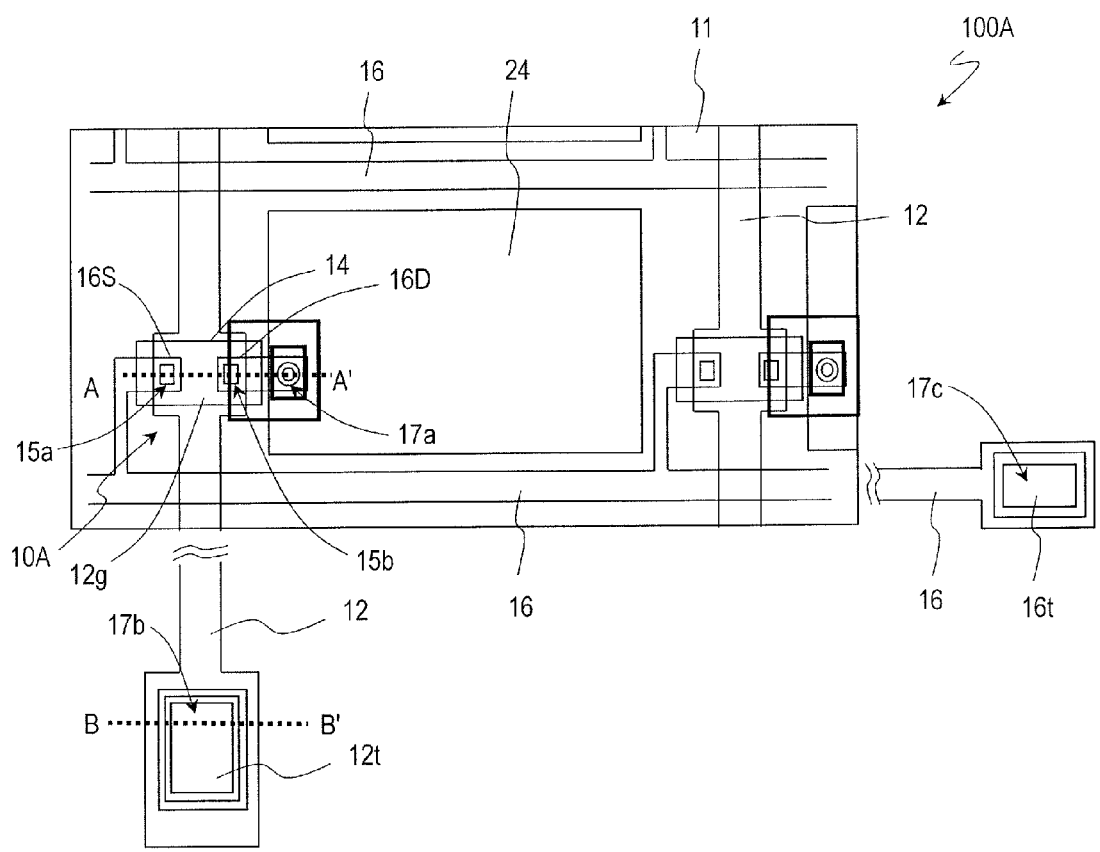
FIG. 1 A schematic plan view of an active-matrix substrate 100A as an embodiment of the present invention.
Figure 2:
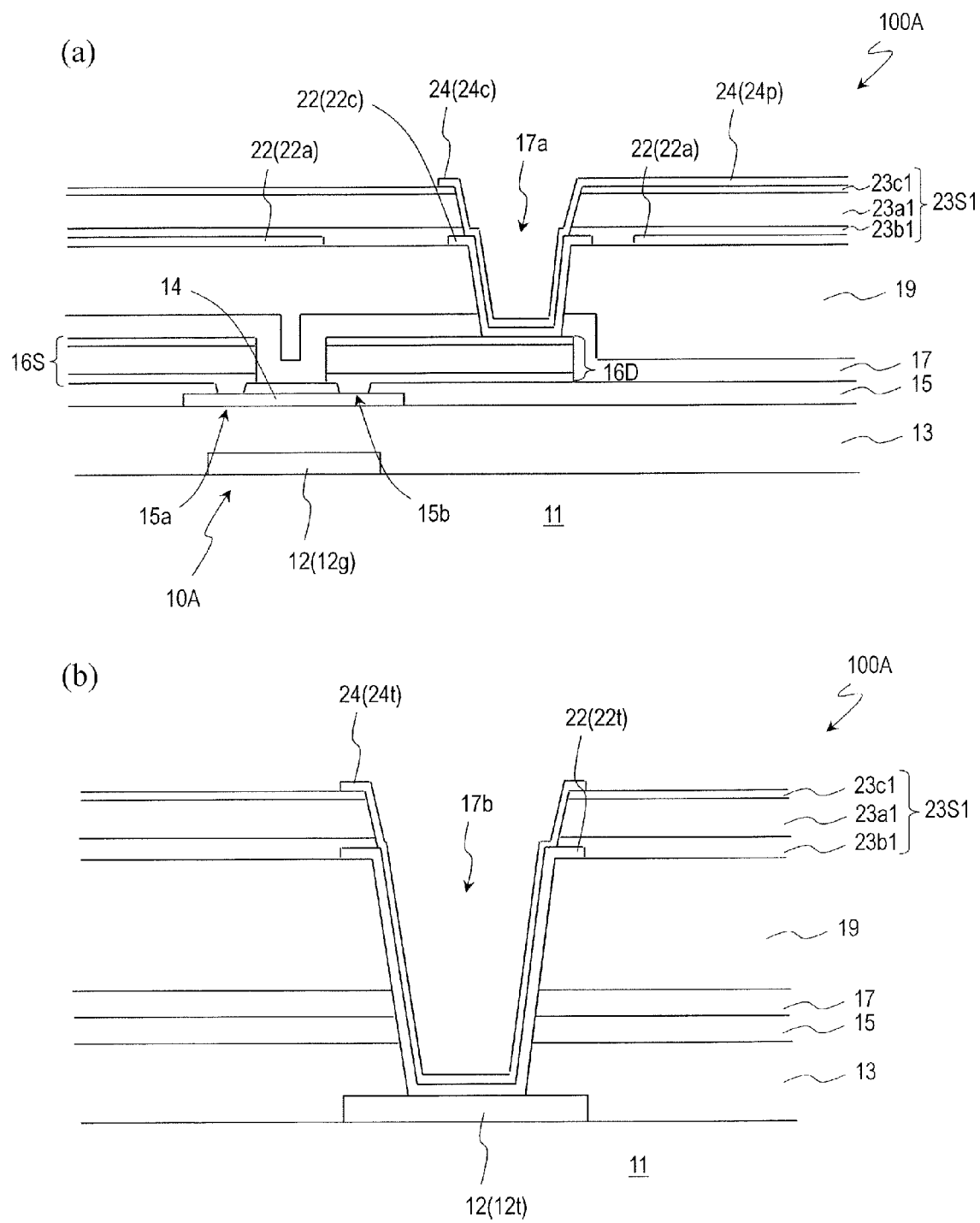
FIGS. 2 (a) and (b) are schematic cross-sectional views of the active-matrix substrate 100A as respectively viewed on the planes A-A' and B-B' shown in FIG. 1.

First of all, it will be described with reference to FIGS. 1 and 2 what structure an active-matrix substrate 100A according to an embodiment of the present invention may have. FIG. 1 is a schematic plan view of an active-matrix substrate 100A as an embodiment of the present invention. FIGS. 2(a) and 2(b) are schematic cross-sectional views of the active-matrix substrate 100A as respectively viewed on the planes A-A' and B-B' shown in FIG. 1.

This active-matrix substrate 100A includes a substrate (which may be a glass substrate, for example) 11, a thin-film transistor (which will be referred to herein as a "TFT") 10A which is supported on the substrate 11 and which includes a semiconductor layer 14, a gate electrode 12g, a source electrode 16S and a drain electrode 16D, first and second transparent conductive layers 22 and 24, at least one of which is electrically connected to the drain electrode 16D of the TFT 10A and has tensile stress, and a stack 23S1 of inorganic insulating layers which has been formed between the first and second transparent conductive layers 22 and 24. In this example, the first transparent conductive layer 22 is arranged closer to the substrate 11 than the second transparent conductive layer 24 is, and the second transparent conductive layer 24 is electrically connected to the drain electrode 16D of the TFT 10A.

In this example, the first and second transparent conductive layers 22 and 24 may be ITO layers or IZO layers. It is known that ITO and IZO layers both have tensile stress. In particular, an ITO layer has greater tensile stress, and will peel more easily, than an IZO layer. It is not quite clear exactly why ITO and IZO layers have tensile stress. However, ITO and IZO layers generally have tensile stress irrespective of the deposition temperature or any other condition. The internal stress (which is either tensile stress or compressive stress) of each of these layers will be described later with reference to FIG. 9.

The stack 23S1 includes a first inorganic insulating layer 23a1 with tensile stress and second and third inorganic insulating layers 23b1 and 23c1 which have been formed so as to sandwich the first inorganic insulating layer 23a1 between them and which have compressive stress. The second inorganic insulating layer 23b1 is arranged closer to the substrate 11 than the first inorganic insulating layer 23a1 is. And the third inorganic insulating layer 23c1 is arranged on the other side of the first inorganic insulating layer 23a1 opposite from the substrate 11. The stack 23S1 as a whole has tensile stress. Also, in this active-matrix substrate 100A, the first inorganic insulating layer 23a1 with tensile stress directly contacts with neither the first transparent conductive layer 22 nor the second transparent conductive layer 24.

In this example, the first inorganic insulating layer 23a1 may be a silicon nitride layer with a refractive index of 1.804 or less, for example, while the second and third inorganic insulating layers 23b1 and 23c1 may be silicon nitride layers with a refractive index of 1.805 or more, for example.

Figure 8:
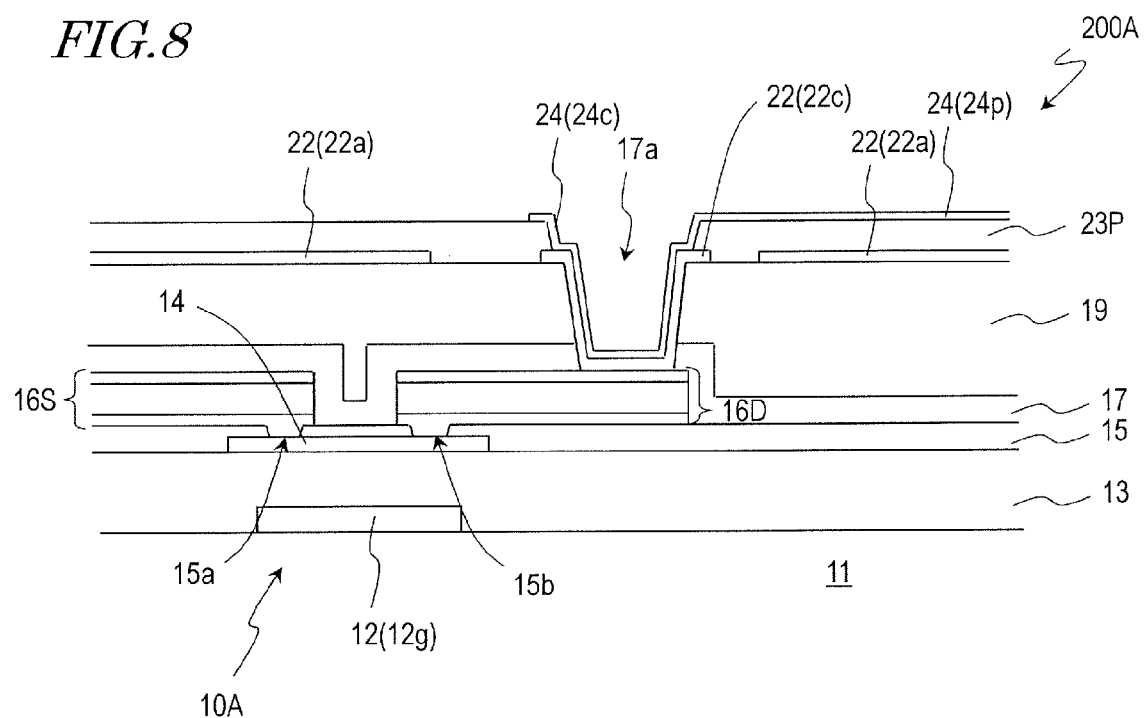
FIG. 8 A schematic cross-sectional view illustrating an active-matrix substrate 200A as a comparative example.

It is known that a silicon nitride layer and a silicon oxide layer generally have compressive stress, with the exception that a silicon nitride layer with a refractive index of 1.804 or less has tensile stress. That is why if a silicon nitride layer with a refractive index of 1.804 or less is used as the third interlevel insulating layer 23P as in the active-matrix substrate 200A of the comparative example shown in FIG. 8, it is possible to prevent the third interlevel insulating layer 23P from peeling. However, such a silicon nitride layer with a refractive index of 1.804 or less has strong reduction ability. For example, if a heat treatment is carried out with such a silicon nitride layer kept in contact with the ITO layers 22 and 24, the silicon nitride layer will reduce and metalize ITO in the vicinity of the interface between itself and the ITO layers 22 and 24. Then, the optical transmittance of the ITO layers 22 and 24 will decrease. The same can be said if IZO layers are used as the first and second transparent conductive layers 22 and 24.

Thus, by using the stack 23S1 in which the silicon nitride layer 23a1 with a refractive index of 1.804 or less (and with tensile stress) is sandwiched between silicon nitride layers 23b1 and 23c1 with a refractive index of 1.805 or more (and with compressive stress), this active-matrix substrate 100A prevents the silicon nitride layer 23a1 with tensile stress and with a refractive index of 1.804 or less from directly contacting with the first transparent conductive layer (which may be an ITO or IZO layer) 22 or the second transparent conductive layer (which may be an ITO or IZO layer) 24.

The stack 23S1 is configured to have tensile stress as a whole. For example, if the thicknesses of the silicon nitride layers 23b1 and 23c1 with a refractive index of 1.805 or more are indicated by thb1 and thc1, respectively, and if the thickness of the silicon nitride layer 23a1 with a refractive index of 1.804 or less is indicated by tha1, the relation tha1≥thb1+thc1 is suitably satisfied. In this case, each of thb1 and thc1 is suitably equal to or smaller than 100 nm independently of each other. Strictly speaking, the magnitudes of the stresses of the respective layers are naturally affected by not only their thicknesses but also the structures (such as compositions) of the respective films. That is why even if the relation described above is not satisfied, the stack 23S1 may still have tensile stress as a whole. The present inventor discovered and confirmed via experiments that if the relation described above is satisfied, the stack 23S1 will have tensile stress as a whole. If thb1 and thc1 were greater than 100 nm, the productivity could decrease in some cases. For that reason, thb1 and thc1 are suitably equal to or smaller than 100 nm independently of each other.

This active-matrix substrate 100A further includes an organic insulating layer 19 which covers the TFT 10A and a portion of which directly contacts with a portion of the stack 23S1. The organic insulating layer 19 may be made of a transparent positive photoresist (photosensitive resin), for example. The organic insulating layer 19 which has been formed on a substrate that is made of an inorganic material such as a glass substrate generally has tensile stress. That is why an inorganic insulating layer with compressive stress has just a low degree of contact with respect to the organic insulating layer 19. Meanwhile, in this active-matrix substrate 100A, a portion of the stack 23S1 with tensile stress contacts with a portion of the organic insulating layer 19, thus achieving a high degree of contact between them. Consequently, the stack 23S1 can make close contact with the first transparent conductive layer 22 and organic insulating layer 19, with which the lower surface of the stack 23S1 contacts, and therefore, its peeling can be minimized.

In the active-matrix substrate 100A according to this embodiment of the present invention, a portion 22a of the first transparent conductive layer 22 is not connected to anything but electrically floating, and therefore, functions as a shield electrode 22a. Meanwhile, a portion 24p of the second transparent conductive layer 24 functions as a pixel electrode. That is to say, the first transparent conductive layer 22 protects the pixel electrode 24p so that the potential of the pixel electrode 24p is not affected by an electric field generated by various electrodes and lines that have been formed on the substrate 11.

Optionally, a portion 22a of the first transparent conductive layer 22 may be used as a storage capacitor counter electrode 22a. In this case, the storage capacitor counter electrode 22a, the pixel electrode 24p and the stack 23S1 arranged between them together function as a storage capacitor. This storage capacitor is formed of the first and second transparent conductive layers 22 and 24, and therefore, can have a large capacitance value without decreasing the aperture ratio of the pixel. That is why it is possible to prevent feedthrough voltage from increasing due to an increase in parasitic capacitance which would be caused by adopting a configuration in which a source contact hole 15a and a drain contact hole 15b have been cut over a gate bus line 12 as in the TFT 10A.

The semiconductor layer 14 may be an oxide semiconductor layer, for example. Since an oxide semiconductor has high mobility, the storage capacitor that has been formed to have a relatively large capacitance value by using the double layer electrode structure can be charged sufficiently quickly. The oxide semiconductor layer may include an In—Ga—Zn—O based semiconductor (which will be referred to herein as an "IGZO based semiconductor"), for example. In this case, the IGZO based semiconductor is a ternary oxide of In (indium), Ga (gallium) and Zn (zinc). The ratios (i.e., mole fractions) of In, Ga and Zn are not particularly limited. For example, In:Ga:Zn=2:2:1, In:Ga:Zn=1:1:1 or In:Ga:Zn=1:1:2 may be satisfied. The IGZO based semiconductor may be either amorphous or crystalline. If the IGZO based semiconductor is a crystalline one, a crystalline IGZO based semiconductor of which the c axis is substantially perpendicular to the layer plane is suitably used. The crystal structure of such an IGZO based semiconductor is disclosed, for example, in Japanese Laid-Open Patent Publication No. 2012-134475, the entire disclosure of which is hereby incorporated by reference.

Figure 9:
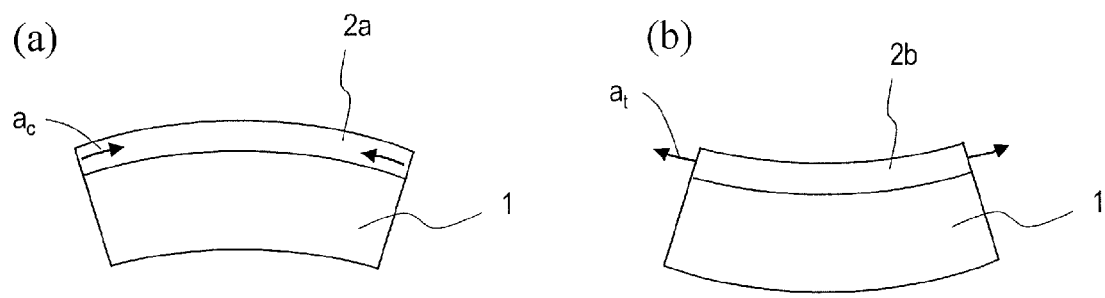
FIGS. 9 (a) and (b) are schematic representations illustrating how to evaluate the internal stress of a film.

Hereinafter, it will be described with reference to FIG. 9 how to evaluate the internal stress of each layer (or film). A film to be evaluated is deposited on a silicon wafer 1. If the silicon wafer 1 warps and protrudes upward as shown in FIG. 9(a), compressive stress $a_c$ has been produced in the film 2a. In this case, tensile stress has been produced in the silicon wafer 1. Conversely, if the silicon wafer 1 warps and protrudes downward as shown in FIG. 9(b), tensile stress at has been produced in the film 2b. In this case, compressive stress has been produced in the silicon wafer 1.

By measuring the magnitude of the warp, the magnitude of the internal stress can be obtained quantitatively based on the moduli of elasticity and dimensions (including the thicknesses and sizes) of the silicon wafer 1 and films 2a and 2b. In this case, a film stress gauge (produced by Tencor) was used to determine whether the internal stress of each layer was tensile stress or compressive stress. The magnitude of the internal stress may be obtained by calculating the radius of curvature using a film stress gauge.

Figure 3:
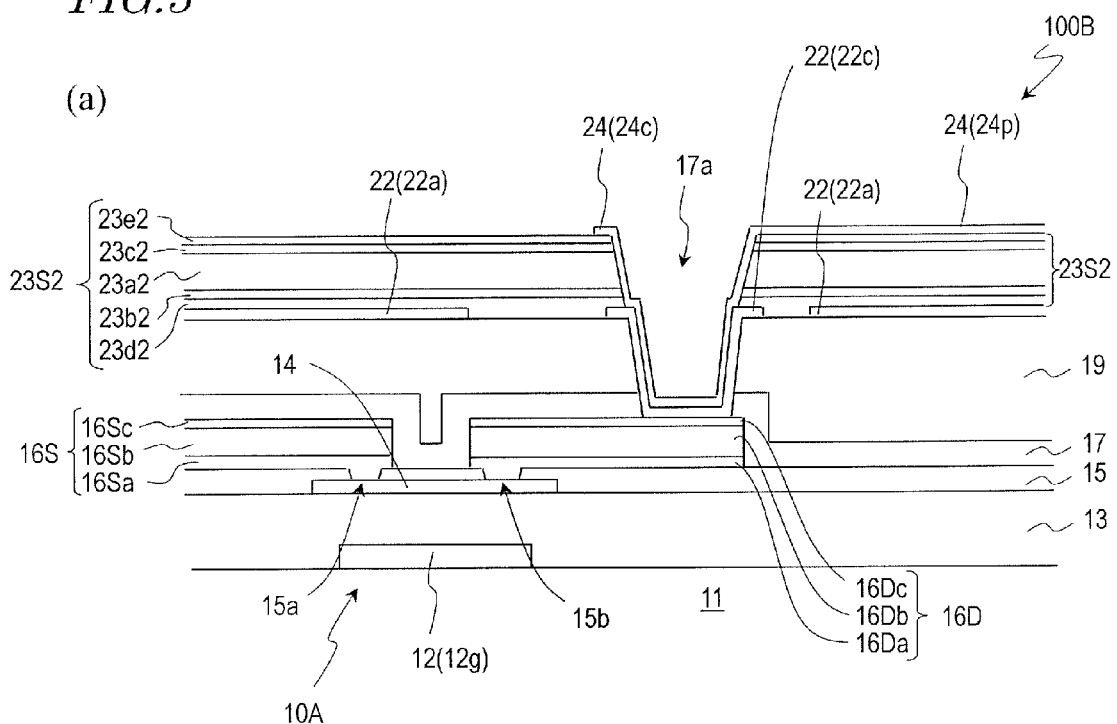
FIGS. 3 (a) and (b) are schematic cross-sectional views of another active-matrix substrate 100B according to an embodiment of the present invention and illustrate cross sections corresponding to the ones shown in FIGS. 2(a) and 2(b), respectively.
Figure 3:
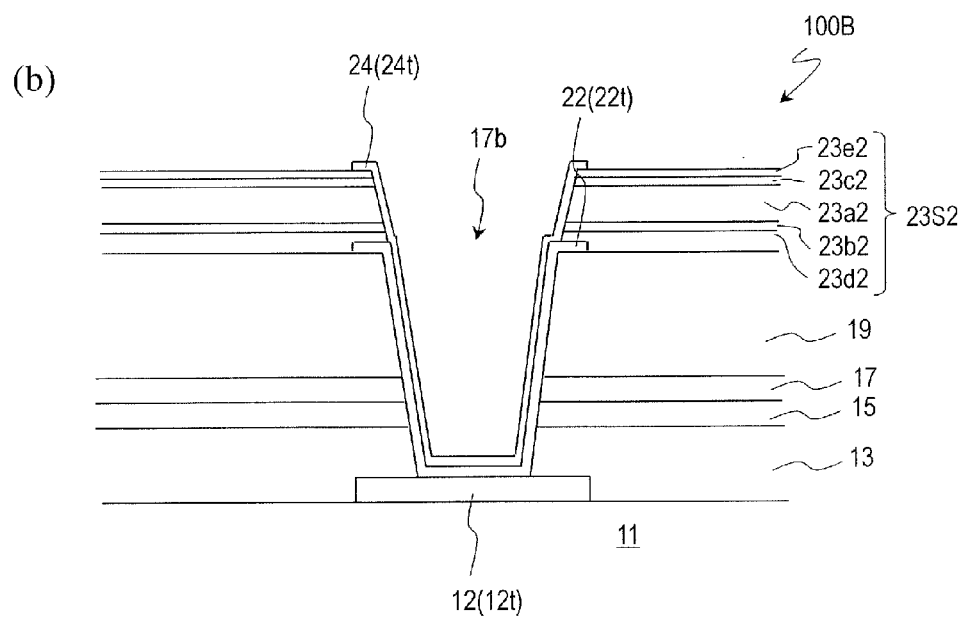

Next, the structure of another active-matrix substrate 100B according to an embodiment of the present invention will be described with reference to FIGS. 1 and 3. FIG. 3 illustrates schematic cross-sectional views of that another active-matrix substrate 100B according to an embodiment of the present invention. FIGS. 3(a) and 3(b) illustrate cross sections of the active-matrix substrate 100B corresponding to the ones shown in FIGS. 2(a) and 2(b), respectively. The planar structure of this active-matrix substrate 100B is the same as that of the active-matrix substrate 100A shown in FIG. 1.

The stack 23S2 of this active-matrix substrate 100B has a different structure from the stack 23S1 of the active-matrix substrate 100A.

The stack 23S2 includes a first inorganic insulating layer 23a2 with tensile stress and second and third inorganic insulating layers 23b2 and 23c2 which have been formed so as to sandwich the first inorganic insulating layer 23a2 between them and which have compressive stress. This portion of the stack has the same structure as the stack 23S1. The stack 23S2 further includes a fourth inorganic insulating layer 23d2 between the first transparent conductive layer 22 and the second inorganic insulating layer 23b2, i.e., on one side of the second inorganic insulating layer 23b2 closer to the substrate 11. And the stack 23S2 further includes a fifth inorganic insulating layer 23e2 between the second transparent conductive layer 24 and the third inorganic insulating layer 23c2, i.e., on one side of the third inorganic insulating layer 23c2 opposite from the substrate 11. Just like the stack 23S1, this stack 23S2 also has tensile stress as a whole.

In this example, the first inorganic insulating layer 23a2 may be a silicon nitride layer with a refractive index of 1.804 or less, for example. The second and third inorganic insulating layers 23b2 and 23c2 may be silicon nitride layers with a refractive index of 1.805 or more, for example. And the fourth and fifth inorganic insulating layers 23d2 and 23e2 may be silicon oxide layers with a refractive index of 1.4 to 1.6, for example. The silicon oxide layers with a refractive index of 1.4 to 1.6 also have compressive stress.

For example, if the thicknesses of the silicon nitride layers 23b2 and 23c2 with a refractive index of 1.805 or more are indicated by thb2 and thc2, respectively, if the thicknesses of the silicon oxide layers 23d2 and 23e2 with a refractive index of 1.4 to 1.6 are indicated by thd2 and the2, respectively, and if the thickness of the silicon nitride layer 23a2 with a refractive index of 1.804 or less is indicated by tha2, the relation tha2≥thb2+thc2+thd2+the2 is suitably satisfied. In this case, each of thb2, thc2, thd2 and the2 is suitably equal to or smaller than 100 nm independently of each other for the same reason as what has already been described. Strictly speaking, the magnitudes of the stresses of the respective layers are naturally affected by not only their thicknesses but also the structures (such as compositions) of the respective films. That is why even if the relation described above is not satisfied, the stack 23S2 may still have tensile stress as a whole. The present inventor discovered and confirmed via experiments that if the relation described above is satisfied, the stack 23S2 will have tensile stress as a whole.

This active-matrix substrate 100B further includes an organic insulating layer 19 which covers the TFT 10A and a portion of which directly contacts with a portion of the stack 23S2. Consequently, just like the stack 23S1 of the active-matrix substrate 100A, the stack 23S2 can also make close contact with the first transparent conductive layer 22 and organic insulating layer 19, with which the lower surface of the stack 23S2 contacts, and therefore, its peeling can be minimized.

Thus, the active-matrix substrate 100B including this stack 23S2 can suppress the reduction reaction of the transparent conductive layers more effectively than the active-matrix substrate 100A including the stack 23S1.

Hereinafter, it will be described with reference to FIGS. 4(a) through 4(d) how to fabricate this active-matrix substrate 100B. FIGS. 4(a) through 4(d) are schematic cross-sectional views illustrating process steps to fabricate the active-matrix substrate 100B and also show cross-sectional structures in the vicinity of the TFT 100A shown in FIG. 3(a) and in the vicinity of the gate terminal portion 12t shown in FIG. 3(b).

Figure 4:
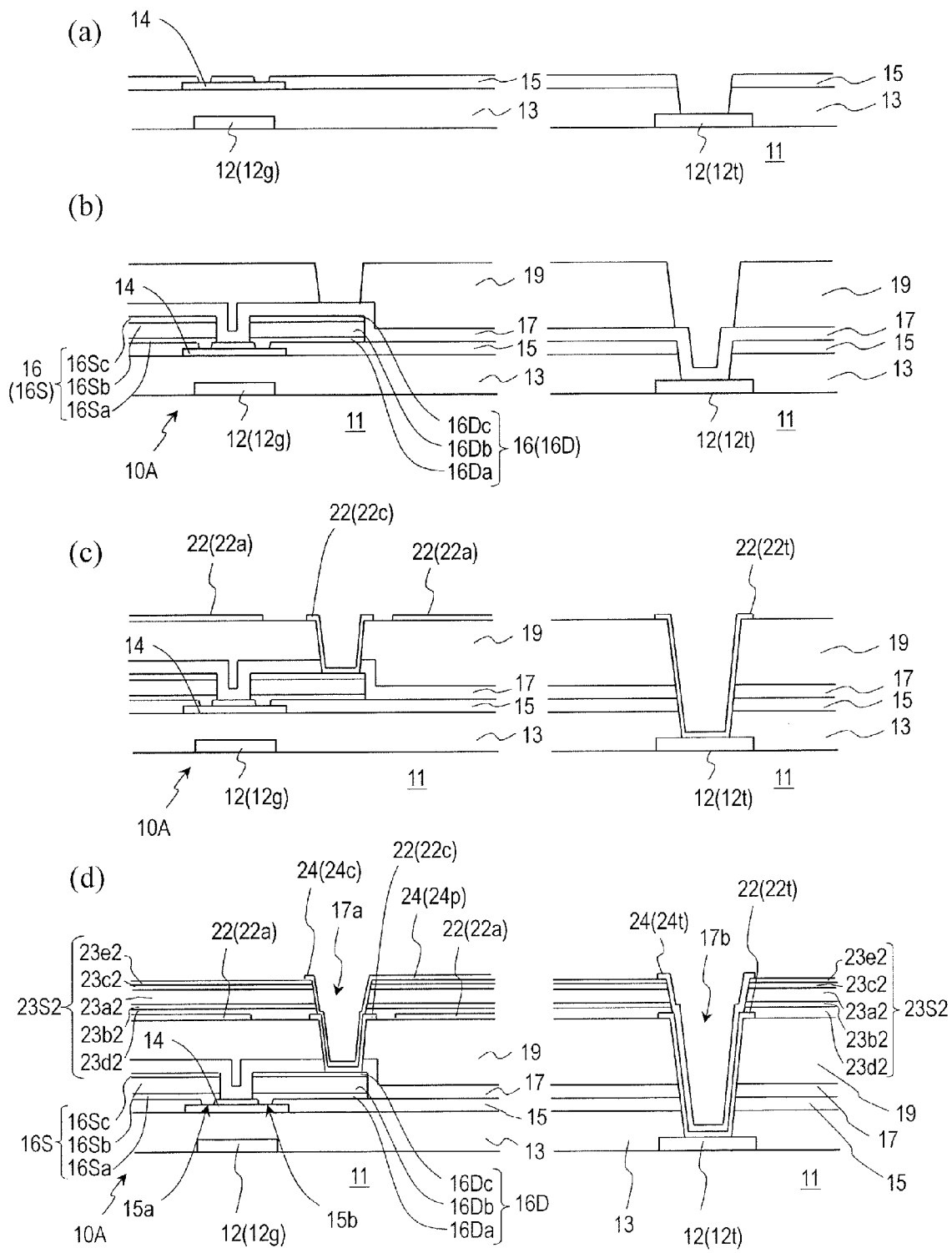
FIGS. 4 (a) through (d) are schematic cross-sectional views illustrating process steps to fabricate the active-matrix substrate 100B.

First of all, as shown in FIG. 4(a), a substrate (which may be a glass substrate, for example) 11 is provided and a gate metal film is deposited on the substrate 11 and patterned, thereby forming a gate metal layer 12, which includes a gate electrode 12g, a gate line, a storage capacitor bus line (CS bus line) and a gate terminal portion 12t. The storage capacitor bus line (not shown) is connected to a storage capacitor counter electrode 22a and supplies a storage capacitor counter voltage to the storage capacitor counter electrode 22a. The gate metal layer 12 may be formed out of any of various known conductive films by a known method. The gate metal layer 12 may be a stack of an MoNb film and an Al film (that is the lower layer). The MoNb and Al films may have a thickness of approximately 20 nm, a thickness of approximately 50 to 200 nm, and a thickness of approximately 300 nm, respectively. Alternatively, the gate metal layer 12 may also be an Al film, a Cu film, a Ta film, or a TaN film, for example.

Next, a gate insulating layer 13 is formed so as to cover the gate metal layer 12. The gate insulating layer 13 may be formed out of a silicon nitride ($SiN_x$) or silicon oxide ($SiO_2$) film with a thickness of approximately 100 to 600 nm or a stack of these films.

Then, a semiconductor layer 14 is formed on the gate insulating layer 13. The semiconductor layer 14 may be an In—Ga—Zn—O based semiconductor (IGZO based semiconductor) layer with a thickness of approximately 20 to 200 nm. Alternatively, the semiconductor layer 14 may also be an oxide semiconductor layer other than the IGZO based semiconductor layer or may even be any other known semiconductor layer such as a polysilicon layer.

Subsequently, an etch stop layer 15 is formed so as to cover the semiconductor layer 14. The etch stop layer 15 has a source contact hole 15a and a drain contact hole 15b (see FIG. 1). A through hole is cut through the gate insulating layer 13 by etching so that the gate terminal portion 12t will be exposed when the etch stop layer 15 is formed. The etch stop layer 15 will protect the semiconductor layer 14 in an etching process step to be performed later to form source and drain electrodes 16S and 16D.

Next, as shown in FIG. 4(b), a source metal layer 16 is formed. The source metal layer 16 includes the source electrode 16S, the drain electrode 16D, a source bus line and a source terminal portion 16t (see FIG. 1). The source electrode 16S may be a stack of an MoN layer 16Sa, and Al layer 16Sb and an MoN layer 16Sc and the drain electrode 16D may be a stack of an MoN layer 16Da, and Al layer 16Db and an MoN layer 16Dc. Naturally, the source metal layer 16 may be formed out of any other conductive films. In this manner, a TFT 10A including the etch stop layer 15 is completed on the semiconductor layer 14.

Thereafter, a first interlevel insulating layer 17 is formed to cover the TFT 10A. The first interlevel insulating layer 17 is typically an inorganic insulating layer and may be formed out of a silicon nitride (SiN$_x$) or silicon oxide (SiO$_2$) film with a thickness of approximately 50 to 500 nm or a stack of these films.

Then, a second interlevel insulating layer 19 is formed on the first interlevel insulating layer 17. The second interlevel insulating layer 19 may be a transparent resin layer with a thickness of approximately 1000 to 5000 nm, for example. The transparent resin layer 19 has a flat surface over the substrate 11. In addition, the transparent resin layer 19 may form a thick film more easily, and has a lower dielectric constant, than an ordinary inorganic insulating layer, and therefore, can reduce the parasitic capacitance between an electrode (such as a pixel electrode) to be formed over the transparent resin layer 19 and the electrode or lines (such as the gate bus line 12 and the source bus line 16) that have been formed under the transparent resin layer 19. Through the first interlevel insulating layer 17 (and the etch stop layer 15 and the gate insulating layer 13), the first, second, and third contact holes (for the pixel electrode, gate and source) 17a, 17b and 17c shown in FIG. 1 have been cut. Also, if a portion 22a of the first transparent conductive layer 22 is used as a storage capacitor counter electrode 22a, a contact hole to connect the storage capacitor counter electrode 22a to the storage capacitor line (not shown) has been cut through the first interlevel insulating layer 17, etch stop layer 15 and gate insulating layer 13. In the process step shown in FIG. 4(b), a through hole (i.e., a hole that exposes the lower layer) is cut through a portion of the second interlevel insulating layer 19 corresponding to the contact hole. The second interlevel insulating layer 19 may be made of a positive photoresist (photosensitive resin), for example, and the through hole may be cut by performing a photolithographic process, for example.

Next, as shown in FIG. 4(c), a contact hole 17a is cut through the first interlevel insulating layer 17 and another contact hole 17b is cut through the first interlevel insulating layer 17, etch stop layer 15 and gate insulating layer 13. In this process step, if necessary, a contact hole to connect the storage capacitor counter electrode 22a to a storage capacitor line (not shown) is cut, too.

Thereafter, a first transparent conductive layer 22 is formed on the second interlevel insulating layer 19. For example, an ITO film may be deposited to a thickness of approximately 40 to 150 nm by sputtering process (under the condition including Ar and O$_2$ flow rates of 300 sccm and 1 sccm, a pressure of 0.6 Pa and a DC power of 2.5 kW). By patterning the ITO film thus obtained, a first transparent conductive layer 22 including a shield electrode or storage capacitor counter electrode 22a, a first contact electrode 22c and a first transparent terminal electrode 22t is obtained.

Subsequently, as shown in FIG. 4(d), a stack 23S2 is formed on the first transparent conductive layer 22.

For example, a silicon oxide layer 23d2, a silicon nitride layer 23b2, a silicon nitride layer 23a2, a silicon nitride layer 23c2, and silicon oxide layer 23e2 may be formed in this order on the first transparent conductive layer 22. The silicon oxide layer 23d2 may be formed under the condition including an SiH$_4$ flow rate of 50 to 300 sccm, an N$_2$O flow rate of 1000 to 7000 sccm, a pressure of 100 to 300 Pa, and an RF power of 400 to 3000 W. The silicon nitride layer 23b2 may be formed under the condition including an SiH$_4$ flow rate of 100 to 500 sccm, an NH$_3$ flow rate of 100 to 1000 sccm, an N$_2$ flow rate of 1000 to 6000 sccm, a pressure of 100 to 300 Pa, and an RF power of 400 to 4000 W. The silicon nitride layer 23a2 may be formed under the condition including an SiH$_4$ flow rate of 100 to 500 sccm, an NH$_3$ flow rate of 100 to 1000 sccm, an N$_2$ flow rate of 1000 to 6000 sccm, a pressure of 100 to 300 Pa, and an RF power of 400 to 4000 W. The silicon nitride layer 23c2 may be formed under the condition including an SiH$_4$ flow rate of 100 to 500 sccm, an NH$_3$ flow rate of 100 to 1000 sccm, an N$_2$ flow rate of 1000 to 6000 sccm, a pressure of 100 to 300 Pa, and an RF power of 200 to 2000 W. And the silicon oxide layer 23e2 may be formed under the condition including an SiH$_4$ flow rate of 50 to 300 sccm, an N$_2$O flow rate of 1000 to 7000 sccm, a pressure of 100 to 300 Pa, and an RF power of 400 to 3000 W. The respective layers may have the following refractive indices and thicknesses. Each of these films was deposited by itself on a silicon wafer and its internal stress was measured with a film stress gauge as already described with reference to FIG. 9. The results are as follows. It should be noted that the magnitude of the internal stress of each layer does not depend on its film thickness.

The silicon oxide layers 23d2 and 23e2 may have a refractive index of 1.46, a thickness of 20 nm and a compressive stress of approximately 50 MPa, for example.

The silicon nitride layers 23b2 and 23c2 may have a refractive index of 1.85, a thickness of 20 nm and a compressive stress of 150 MPa, for example.

And the silicon nitride layer 23a2 may have a refractive index of 1.75, a thickness of 200 nm and a tensile stress of 200 MPa, for example.

Next, a second transparent conductive layer 24 is formed. Just like the first transparent conductive layer 22, an ITO film may be deposited to a thickness of approximately 40 to 150 nm by sputtering process. By patterning the ITO film thus obtained, a second transparent conductive layer 24 including a pixel electrode 24p, a second contact electrode 24c and a second transparent terminal electrode 24t is obtained.

In this manner, the active-matrix substrate 100B shown in FIG. 3 is completed. It should be noted that if the silicon oxide layers 23d2 and 23e2 are omitted, the active-matrix substrate 100A can also be fabricated in the same way.

Figure 5:
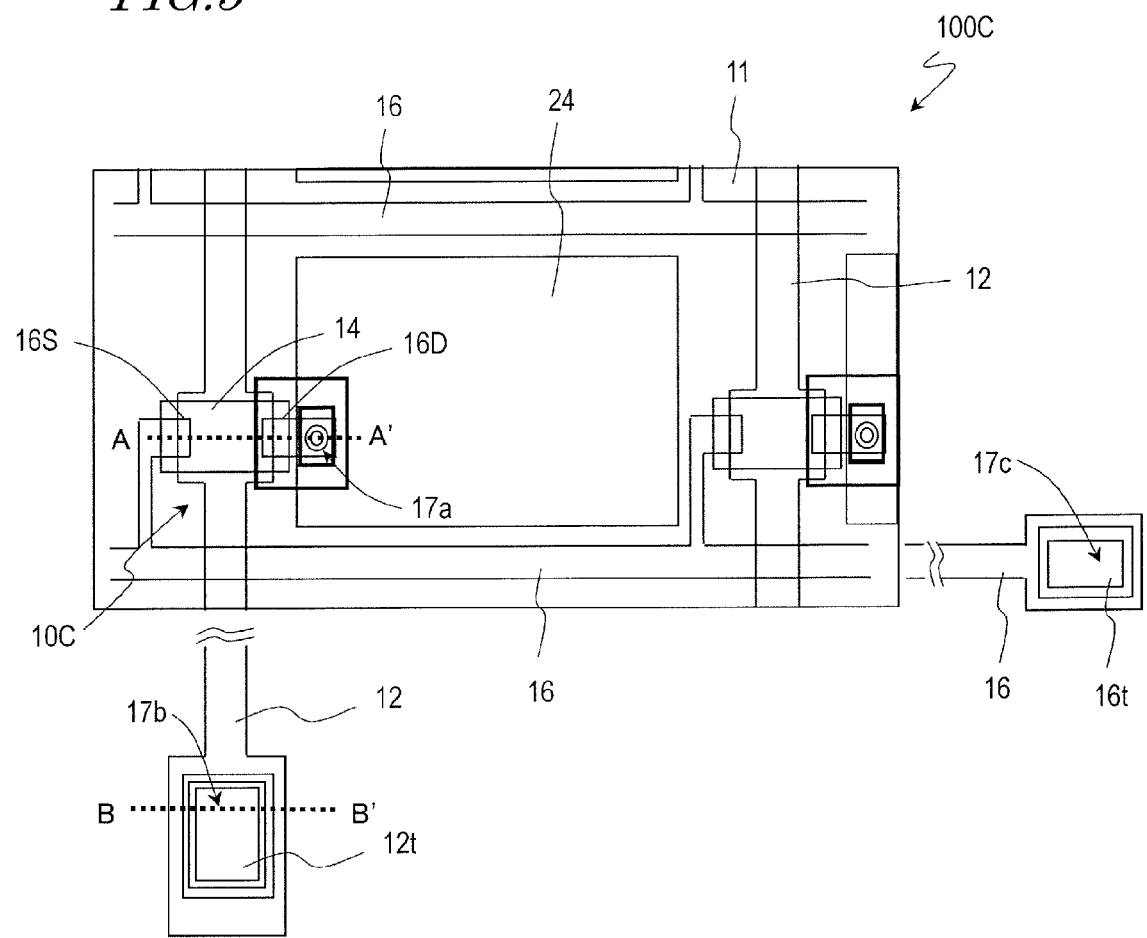
FIG. 5 A schematic plan view of an active-matrix substrate 100C as still another embodiment of the present invention.
Figure 6:
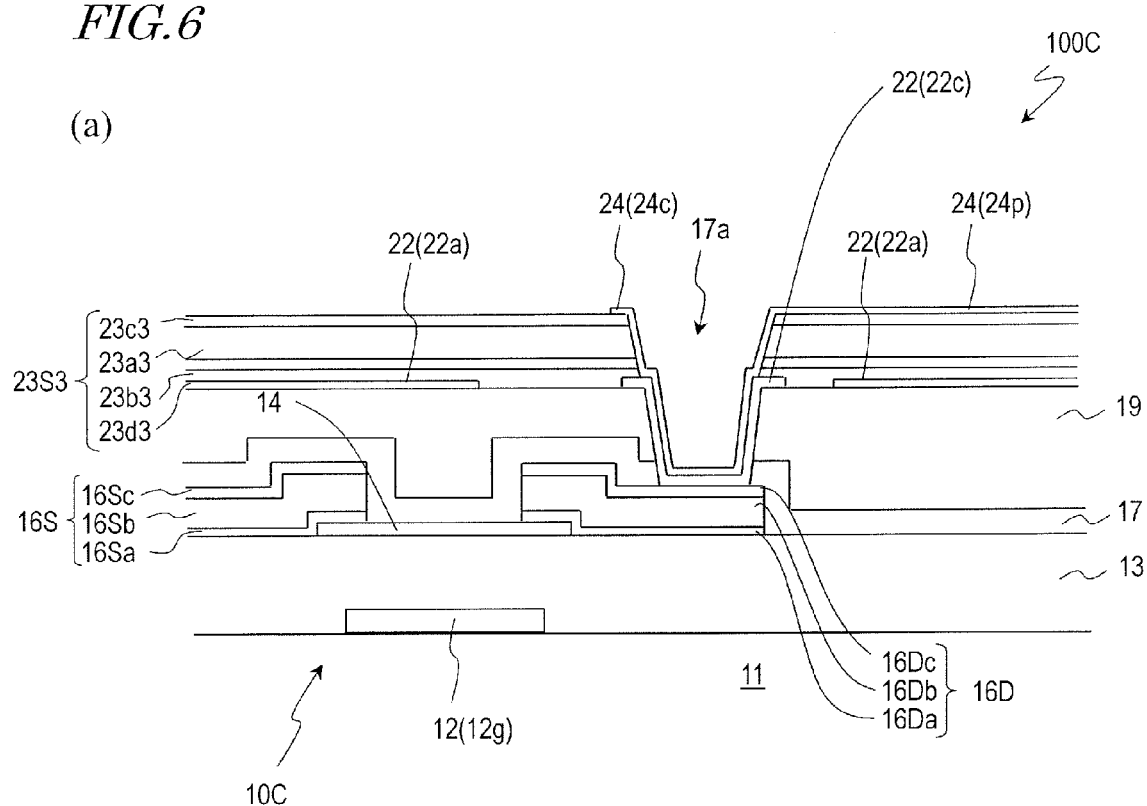
FIGS. 6 (a) and (b) are schematic cross-sectional views of the active-matrix substrate 100C as respectively viewed on the planes A-A' and B-B' shown in FIG. 5.
Figure 6:
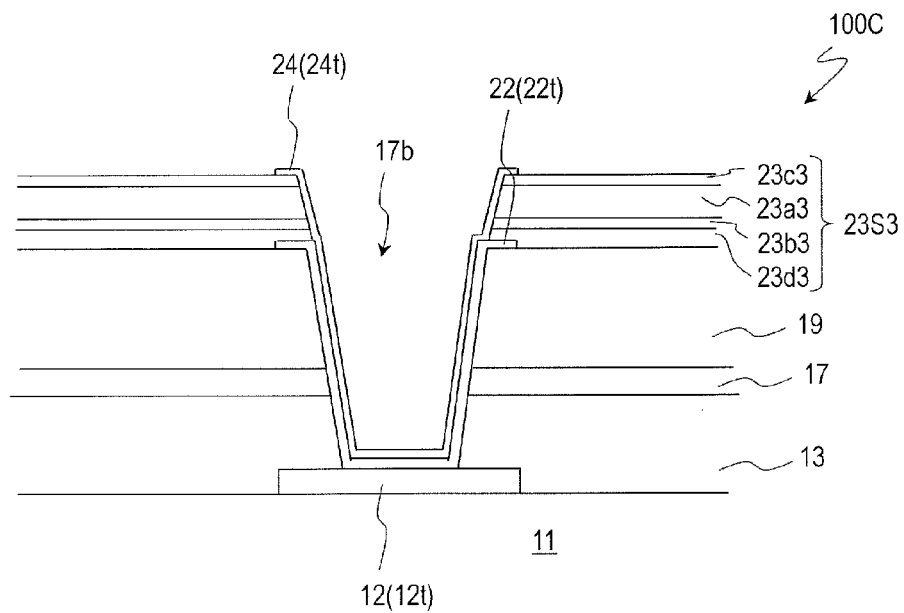

Hereinafter, the structure of still another active-matrix substrate 100C according to an embodiment of the present invention will be described with reference to FIGS. 5 and 6. FIG. 5 is a schematic plan view of that still another active-matrix substrate 100C according to an embodiment of the present invention. FIGS. 6(a) and 6(b) are schematic cross-sectional views of the active-matrix substrate 100C as respectively viewed on the planes A-A' and B-B' shown in FIG. 5.

Although the stack 23S2 of the active-matrix substrate 100B described above includes five inorganic insulating layers, one of the fourth and fifth inorganic insulating layers 23d2 and 23e2 may be omitted. The stack 23S3 of this active-matrix substrate 100C does not include the fifth inorganic insulating layer 23e2 of the stack 23S2 of the active-matrix substrate 100B.

That is to say, the stack 23S3 includes a first inorganic insulating layer 23a3 with tensile stress and second and third inorganic insulating layers 23b3 and 23c3 which have been formed so as to sandwich the first inorganic insulating layer 23a3 between them and which have compressive stress. This portion of the stack has the same structure as the stack 23S1. The stack 23S3 further includes a fourth inorganic insulating layer 23d3 between the first transparent conductive layer 22 and the second inorganic insulating layer 23b3, i.e., on one side of the second inorganic insulating layer 23b3 closer to the substrate 11. Just like the stacks 23S1 and 23S2, this stack 23S3 also has tensile stress as a whole.

In this example, the first inorganic insulating layer 23a3 may be a silicon nitride layer with a refractive index of 1.804 or less, for example. The second and third inorganic insulating layers 23b3 and 23c3 may be silicon nitride layers with a refractive index of 1.805 or more, for example. And the fourth inorganic insulating layer 23d3 may be a silicon oxide layer with a refractive index of 1.4 to 1.6, for example.

For example, if the thicknesses of the silicon nitride layers 23b3 and 23c3 with a refractive index of 1.805 or more are indicated by thb3 and thc3, respectively, if the thickness of the silicon oxide layer 23d3 with a refractive index of 1.4 to 1.6 is indicated by thd3, and if the thickness of the silicon nitride layer 23a3 with a refractive index of 1.804 or less is indicated by tha3, the relation tha3≥thb3+thc3+thd3 is suitably satisfied. In this case, each of thb3, thc3, and thd3 is suitably equal to or smaller than 100 nm independently of each other for the same reason as what has already been described. Strictly speaking, the magnitudes of the stresses of the respective layers are naturally affected by not only their thicknesses but also the structures (such as compositions) of the respective films. That is why even if the relation described above is not satisfied, the stack 23S3 may still have tensile stress as a whole. The present inventor discovered and confirmed via experiments that if the relation described above is satisfied, the stack 23S3 will have tensile stress as a whole.

This active-matrix substrate 100C further includes an organic insulating layer 19 which covers the TFT 10C and a portion of which directly contacts with a portion of the stack 23S3. Consequently, just like the stack 23S1 of the active-matrix substrate 100A and the stack 23S2 of the active-matrix substrate 100B, the stack 23S3 can also make close contact with the first transparent conductive layer 22 and organic insulating layer 19, with which the lower surface of the stack 23S3 contacts, and therefore, its peeling can be minimized.

Thus, the active-matrix substrate 100C including this stack 23S3 can suppress the reduction reaction of the transparent conductive layers more effectively than the active-matrix substrate 100A including the stack 23S1.

Even though the TFT 10A of the active-matrix substrates 100A and 100B described above is an etch stop type TFT, the TFT 10C of this active-matrix substrate 100C is a channel etch type TFT.

Hereinafter, it will be described with reference to FIGS. 7(a) through 7(d) how to fabricate this active-matrix substrate 100C. FIGS. 7(a) through 7(d) are schematic cross-sectional views illustrating process steps to fabricate the active-matrix substrate 100C and also show cross-sectional structures in the vicinity of the TFT 10C shown in FIG. 6(a) and in the vicinity of the gate terminal portion 12t shown in FIG. 6(b). In the following description, the materials and thicknesses of the respective components may be the same as what has already been described with reference to FIGS. 4(a) through 4(d) and will not be described all over again.

Figure 7:
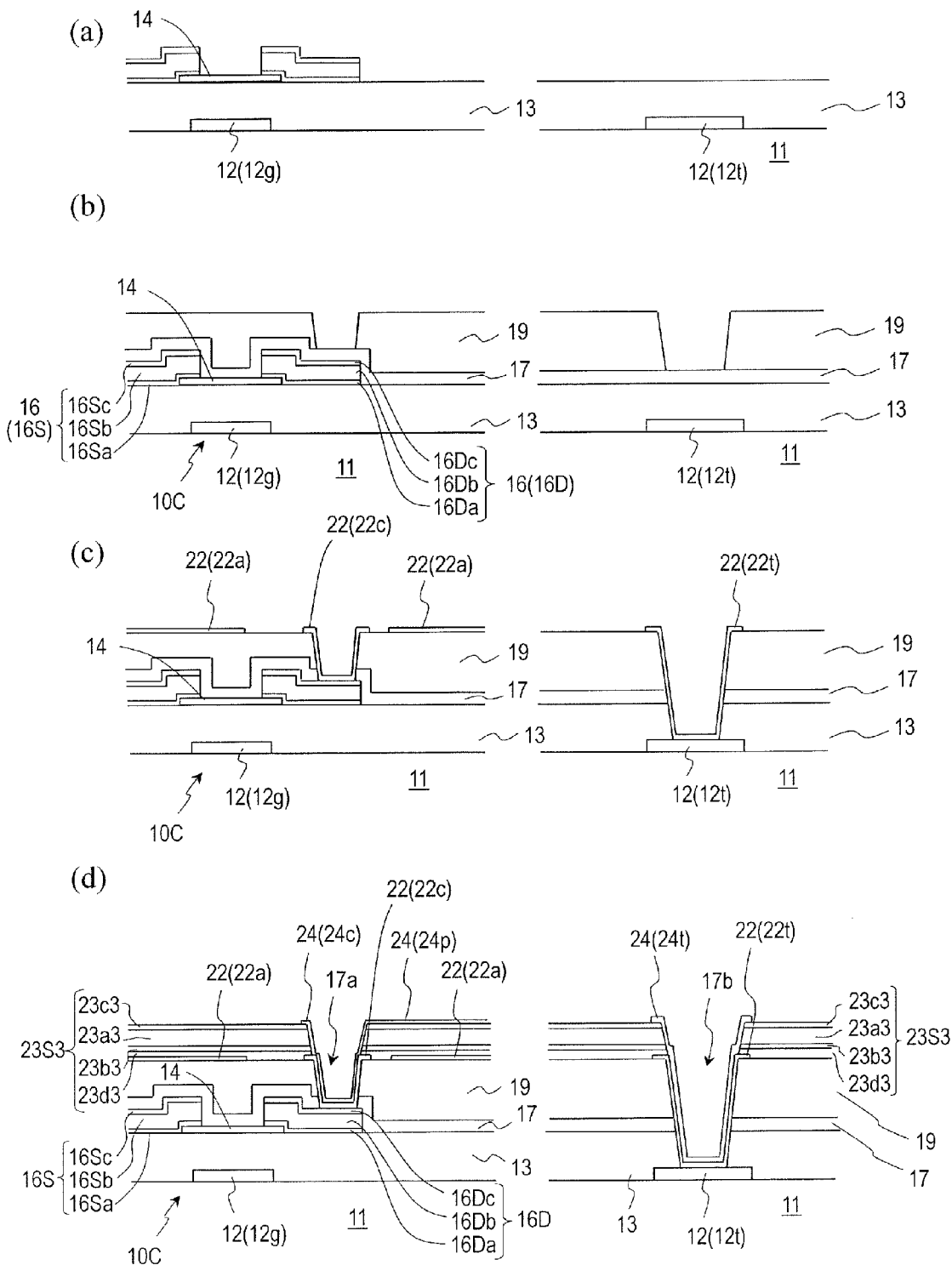
FIGS. 7 (a) through (d) are schematic cross-sectional views illustrating process steps to fabricate the active-matrix substrate 100C.

First of all, as shown in FIG. 7(a), a substrate 11 is provided and a gate metal film is deposited on the substrate 11 and patterned, thereby forming a gate metal layer 12, which includes a gate electrode 12g, a gate line, a storage capacitor bus line (CS bus line) and a gate terminal portion 12t.

Next, a gate insulating layer 13 is formed so as to cover the gate metal layer 12. Then, a semiconductor layer 14 is formed on the gate insulating layer 13.

Thereafter, a source metal layer 16 including source and drain electrodes 16S and 16D is formed.

Subsequently, a first interlevel insulating layer is formed to cover the TFT 10C. Through the first interlevel insulating layer 17 (and the gate insulating layer 13), the first, second, and third contact holes (for the pixel electrode, gate and source) 17a, 17b and 17c shown in FIG. 5 have been cut. Also, if a portion 22a of the first transparent conductive layer 22 is used as a storage capacitor counter electrode 22a, a contact hole to connect the storage capacitor counter electrode 22a to the storage capacitor line (not shown) has been cut through the first interlevel insulating layer 17 and gate insulating layer 13. In the process step shown in FIG. 7(b), a through hole (i.e., a hole that exposes the lower layer) is cut through a portion of the second interlevel insulating layer 19 corresponding to the contact hole.

Next, as shown in FIG. 7(c), a contact hole 17a is cut through the first interlevel insulating layer 17 and another contact hole 17b is cut through the first interlevel insulating layer 17 and gate insulating layer 13. In this process step, if necessary, a contact hole to connect the storage capacitor counter electrode 22a to a storage capacitor line (not shown) is cut, too.

Thereafter, a first transparent conductive layer 22 is formed on the second interlevel insulating layer 19. For example, by patterning an ITO film, a first transparent conductive layer 22 including a shield electrode or storage capacitor counter electrode 22a, a first contact electrode 22c and a first transparent terminal electrode 22t is obtained.

Subsequently, as shown in FIG. 7(d), a stack 23S3 is formed on the first transparent conductive layer 22. The stack 23S3 can be formed in the same way by omitting the silicon dioxide layer 23e2 from FIG. 4(d). Thereafter, a second transparent conductive layer 24 is formed. By patterning an ITO film, a second transparent conductive layer including a pixel electrode 24p, a second contact electrode 24c and a second transparent terminal electrode 24t is obtained. In this manner, the active-matrix substrate 100C shown in FIGS. 5 and 6 is obtained.

In the foregoing description, an active-matrix substrate 100C including a channel etch type TFT has been described as an example. However, this embodiment is also applicable to the etch stop type active-matrix substrate described above. Conversely, the stack 23S1 or 23S2 described above may be applied to an active-matrix substrate including the channel etch type TFT.

In the foregoing description of embodiments, an active-matrix substrate for use in a VA mode liquid crystal display device with a double layer electrode structure has been described as an example. However, this is just an example of the present invention. But embodiments of the present invention are also applicable to an active-matrix substrate for use in a liquid crystal display device operating in any of various other modes. For example, if an embodiment of the present invention is applied to an active-matrix substrate for use in an FFS mode liquid crystal display device, the first transparent conductive layer 22 will be a common electrode and the second transparent conductive layer 24 will be a pixel electrode with a number of slits.

INDUSTRIAL APPLICABILITY

Embodiments of the present invention are applicable to various active-matrix substrates, and can be used particularly effectively in an active-matrix substrate for a liquid crystal display device.

REFERENCE SIGNS LIST 10A, 10C thin-film transistor (TFT)
11 substrate
12 gate metal layer (gate bus line)
12g gate electrode
12t gate terminal portion
13 gate insulating layer
14 semiconductor layer 15 etch stop layer
15a, 15b contact hole (for source and drain)
16 source metal layer (source bus line)
16S source electrode
16D drain electrode
16t source terminal portion
17 first interlevel insulating layer (inorganic insulating layer)
17a first contact hole (for pixel electrode)
17b second contact hole (for gate)
17c third contact hole (for source)
19 second interlevel insulating layer (transparent resin layer)
22 first transparent conductive layer
22a shield electrode or storage capacitor counter electrode
22c first contact electrode
22t first transparent terminal electrode
23P third interlevel insulating layer
23S1, 23S2, 23S3 stack of inorganic insulating layers
23a1, 23b1, 23c1 inorganic insulating layer
23a2, 23b2, 23c2, 23d2, 23e2 inorganic insulating layer
23a3, 23b3, 23c3, 23d3 inorganic insulating layer
24 second transparent conductive layer
24c second contact electrode
24p pixel electrode
24t second transparent terminal electrode
100, 100A, 100B, 100C active-matrix substrate

The invention claimed is:

1. An active-matrix substrate comprising:
   a substrate;
   a thin-film transistor which is supported on the substrate and which includes a semiconductor layer, a gate electrode, a source electrode and a drain electrode;
   first and second transparent conductive layers, at least one of which is electrically connected to the drain electrode of the thin-film transistor; and
   a stack of inorganic insulating layers which has been formed between the first and second transparent conductive layers,
   wherein the stack includes a first inorganic insulating layer with tensile stress and second and third inorganic insulating layers which have been formed so as to sandwich the first inorganic insulating layer between them and which have compressive stress, and the stack as a whole has tensile stress.

2. The active-matrix substrate of claim 1, wherein the first inorganic insulating layer is a silicon nitride layer with a refractive index of 1.804 or less.

3. The active-matrix substrate of claim 1, wherein the second and third inorganic insulating layers are silicon nitride layers with a refractive index of 1.805 or more.

4. The active-matrix substrate of claim 1, wherein the first transparent conductive layer is arranged closer to the substrate than the second transparent conductive layer is, and the second inorganic insulating layer is arranged closer to the substrate than the third inorganic insulating layer is, and
   the stack further includes a fourth inorganic insulating layer between the first transparent conductive layer and the second inorganic insulating layer.

5. The active-matrix substrate of claim 4, wherein the fourth inorganic insulating layer is a silicon oxide layer with a refractive index of 1.4 to 1.6.

6. The active-matrix substrate of claim 4, wherein the stack further includes a fifth inorganic insulating layer between the second transparent conductive layer and the third inorganic insulating layer.

7. The active-matrix substrate of claim 6, wherein the fifth inorganic insulating layer is a silicon oxide layer with a refractive index of 1.4 to 1.6.

8. The active-matrix substrate of claim 1, wherein the first and second transparent conductive layers are either ITO layers or IZO layers.

9. The active-matrix substrate of claim 1, wherein the semiconductor layer is an oxide semiconductor layer.

10. The active-matrix substrate of claim 1, wherein the first transparent conductive layer is electrically floating and the second transparent conductive layer is a pixel electrode.

11. The active-matrix substrate of claim 1, wherein the first transparent conductive layer is a storage capacitor counter electrode and the second transparent conductive layer is a pixel electrode.

12. The active-matrix substrate of claim 1, wherein the first transparent conductive layer is a common electrode and the second transparent conductive layer is a pixel electrode with a plurality of slits.

13. The active-matrix substrate of claim 1, comprising an organic insulating layer which covers the thin-film transistor and a portion of which contacts directly with a portion of the stack.

* * * * *